United States Patent
Zhao

(10) Patent No.: US 10,109,967 B2
(45) Date of Patent: Oct. 23, 2018

(54) ELECTRICAL CONNECTOR HAVING A SHIELDING PLATE THINNED REGIONFOR DISTANCING FROM FRONT BENDS OF DIFFERENTIAL SIGNAL PAIR

(71) Applicant: FOXCONN INTERCONNECT TECHNOLOGY LIMITED, Grand Cayman (KY)

(72) Inventor: Jun Zhao, Huaian (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/824,933

(22) Filed: Nov. 28, 2017

(65) Prior Publication Data
US 2018/0151992 A1 May 31, 2018

(30) Foreign Application Priority Data

Nov. 28, 2016 (CN) ...................... 2016 2 1283828 U

(51) Int. Cl.
| | |
|---|---|
| *H01R 12/06* | (2006.01) |
| *H01R 24/60* | (2011.01) |
| *H01R 13/627* | (2006.01) |
| *H01R 13/6582* | (2011.01) |
| *H01R 13/6587* | (2011.01) |

(Continued)

(52) U.S. Cl.
CPC ........... *H01R 24/60* (2013.01); *H01R 13/514* (2013.01); *H01R 13/6273* (2013.01); *H01R 13/652* (2013.01); *H01R 13/6582* (2013.01); *H01R 13/6587* (2013.01); *H01R 13/6591* (2013.01); *H01R 24/28* (2013.01);

(Continued)

(58) Field of Classification Search
CPC . H01R 24/60; H01R 13/6273; H01R 13/6582
USPC ..................................................... 439/607.23
See application file for complete search history.

(56) References Cited

U.S. PATENT DOCUMENTS

| 8,684,769 B2 * | 4/2014 | Kao | .................... H01R 13/6471 |
| | | | 439/607.28 |
| 9,022,800 B2 * | 5/2015 | Yang | .................. H01R 13/6581 |
| | | | 439/487 |

(Continued)

FOREIGN PATENT DOCUMENTS

| CN | 204118317 U | 1/2015 |
| CN | 204391414 U | 6/2015 |
| CN | 104810657 B | 5/2017 |

*Primary Examiner* — Alexander Gilman
(74) *Attorney, Agent, or Firm* — Wei Te Chung; Ming Chieh Chang

(57) ABSTRACT

An electrical connector includes: an insulative housing; an upper and lower rows of contacts secured in the insulative housing, each contact having a front contacting portion; a shielding shell enclosing the insulative housing; and a shielding plate mounted in the insulative housing; wherein each row of contacts include a pair of differential signal contacts, the contacting portion of each of the pair of differential signal contacts having a front bend; the shielding plate spans between and forwardly beyond the front contacting portions of the upper pair of differential signal contacts and the front contacting portions of the lower pair of differential signal contacts, the shielding plate having a front thinned region; and the front bend is bent toward the front thinned region.

5 Claims, 6 Drawing Sheets

(51) Int. Cl.
  *H01R 13/6591*  (2011.01)
  *H01R 13/652*  (2006.01)
  *H01R 13/514*  (2006.01)
  *H05K 1/18*  (2006.01)
  *H01R 107/00*  (2006.01)
  *H01R 24/28*  (2011.01)
  *H05K 1/11*  (2006.01)

(52) U.S. Cl.
  CPC .......... *H01R 2107/00* (2013.01); *H05K 1/117* (2013.01); *H05K 1/184* (2013.01)

(56) References Cited

U.S. PATENT DOCUMENTS

| | | | | |
|---|---|---|---|---|
| 9,231,356 B1* | 1/2016 | Ju | ................. | H01R 24/78 |
| 9,300,095 B2* | 3/2016 | Lin | ................. | H01R 24/60 |
| 9,306,336 B2* | 4/2016 | Chang | ................. | H01R 13/6471 |
| 9,425,559 B2* | 8/2016 | Kao | ................. | H01R 13/6585 |
| 9,502,821 B2 | 11/2016 | Little et al. | | |
| 9,865,974 B2* | 1/2018 | Chen | ................. | H01R 24/62 |
| 9,917,405 B2* | 3/2018 | Ju | ................. | H01R 13/6585 |
| 9,935,401 B2* | 4/2018 | Tsai | ................. | H01R 13/652 |
| 9,948,041 B2* | 4/2018 | Chen | ................. | H01R 24/62 |
| 9,948,046 B1* | 4/2018 | Peng | ................. | H01R 27/02 |
| 9,960,552 B2* | 5/2018 | Tsai | ................. | H01R 24/64 |
| 2015/0194770 A1* | 7/2015 | Little | ................. | H01R 13/6582 439/607.27 |
| 2015/0295362 A1* | 10/2015 | Tziviskos | ................. | H01R 13/6581 439/607.01 |
| 2015/0340791 A1* | 11/2015 | Kao | ................. | H01R 24/60 439/676 |
| 2016/0013599 A1* | 1/2016 | Ueda | ................. | H01R 13/6596 439/607.01 |
| 2016/0064869 A1* | 3/2016 | Yu | ................. | H01R 24/60 439/607.05 |

* cited by examiner

ELECTRICAL CONNECTOR HAVING A SHIELDING PLATE THINNED REGION FOR DISTANCING FROM FRONT BENDS OF DIFFERENTIAL SIGNAL PAIR

BACKGROUND OF THE INVENTION

1. Field of the Invention

The present invention relates to an electrical connector having a middle shielding plate shielded between two rows of contacts, each row of contacts including a differential signal pair and the shielding plate being designed to address concerns that any portions of the differential signal contacts become close to the shielding plate.

2. Description of Related Arts

China Patent No. 204391414 discloses an electrical connector comprising an insulative housing having a base and a tongue, a shielding plate affixed to the tongue portion, and two rows of contacts at an upper side and a lower side of the shielding plate. Each row of contacts include one or more high-speed differential signal pairs. A thickness of the portion of the shielding plate opposing the high-speed differential signal pairs is reduced to increase a distance therebetween for impedance matching consideration.

On the other hand, it is known for a reversible or dual orientation USB Type-C plug connector to have contacts with front bends embedded or buried in the insulative housing for manufacturing consideration.

SUMMARY OF THE INVENTION

An electrical connector comprises: an insulative housing having a base and a tongue; an upper and lower rows of contacts secured in the insulative housing and exposed to two opposite surfaces of the tongue, respectively, each contact having a front contacting portion; a shielding shell enclosing the insulative housing; and a shielding plate mounted in the insulative housing; wherein each row of contacts include a pair of differential signal contacts, the contacting portion of each of the pair of differential signal contacts having a front bend; the shielding plate spans between and forwardly beyond the front contacting portions of the upper pair of differential signal contacts and the front contacting portions of the lower pair of differential signal contacts, the shielding plate having a front thinned region; and the front bend is bent toward the front thinned region.

DETAILED DESCRIPTION OF THE PREFERRED EMBODIMENT

Figure 1:
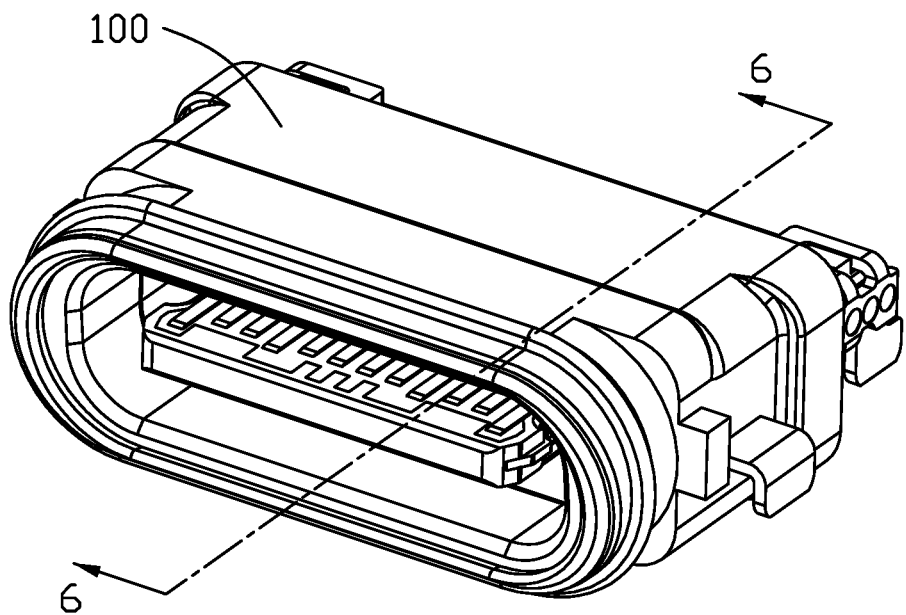
FIG. 1 is a perspective view of an electrical connector in accordance with the present invention.
Figure 2:
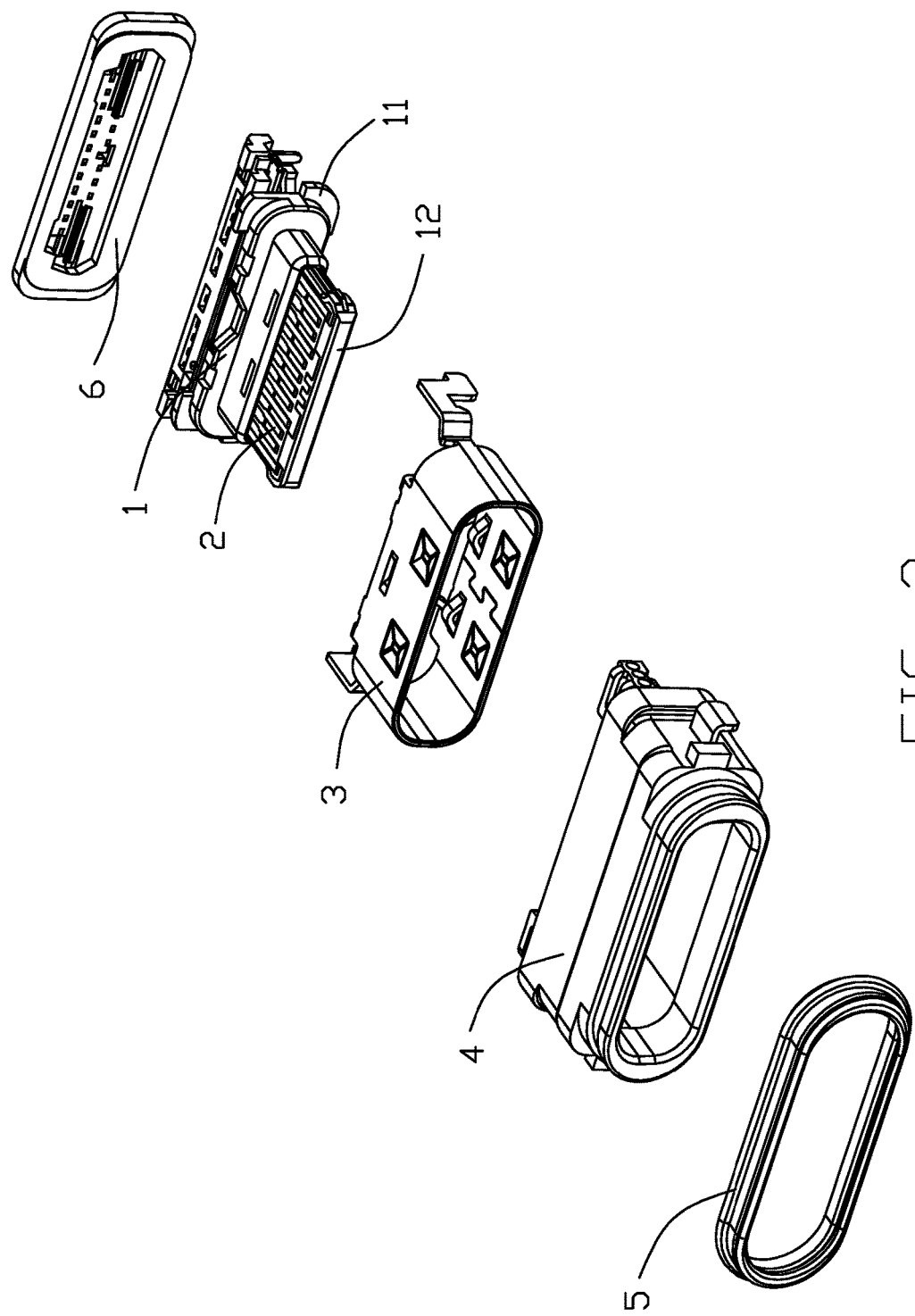
FIG. 2 is an exploded view of the electrical connector.

Referring to FIGS. 1 and 2, an electrical connector 100 for mounting to a printed circuit board includes an insulative housing 1, two rows of contacts 2 secured in the insulative housing 1, a shielding shell 3 enclosing the insulative housing 1, and a pair of shielding plates 7 mounted in the insulative housing 1. The electrical connector 100 may further include an outer cover 4 enclosing the shielding shell 4, a front sealing member or sealer 5, and a rear sealer 6.

Figure 3:
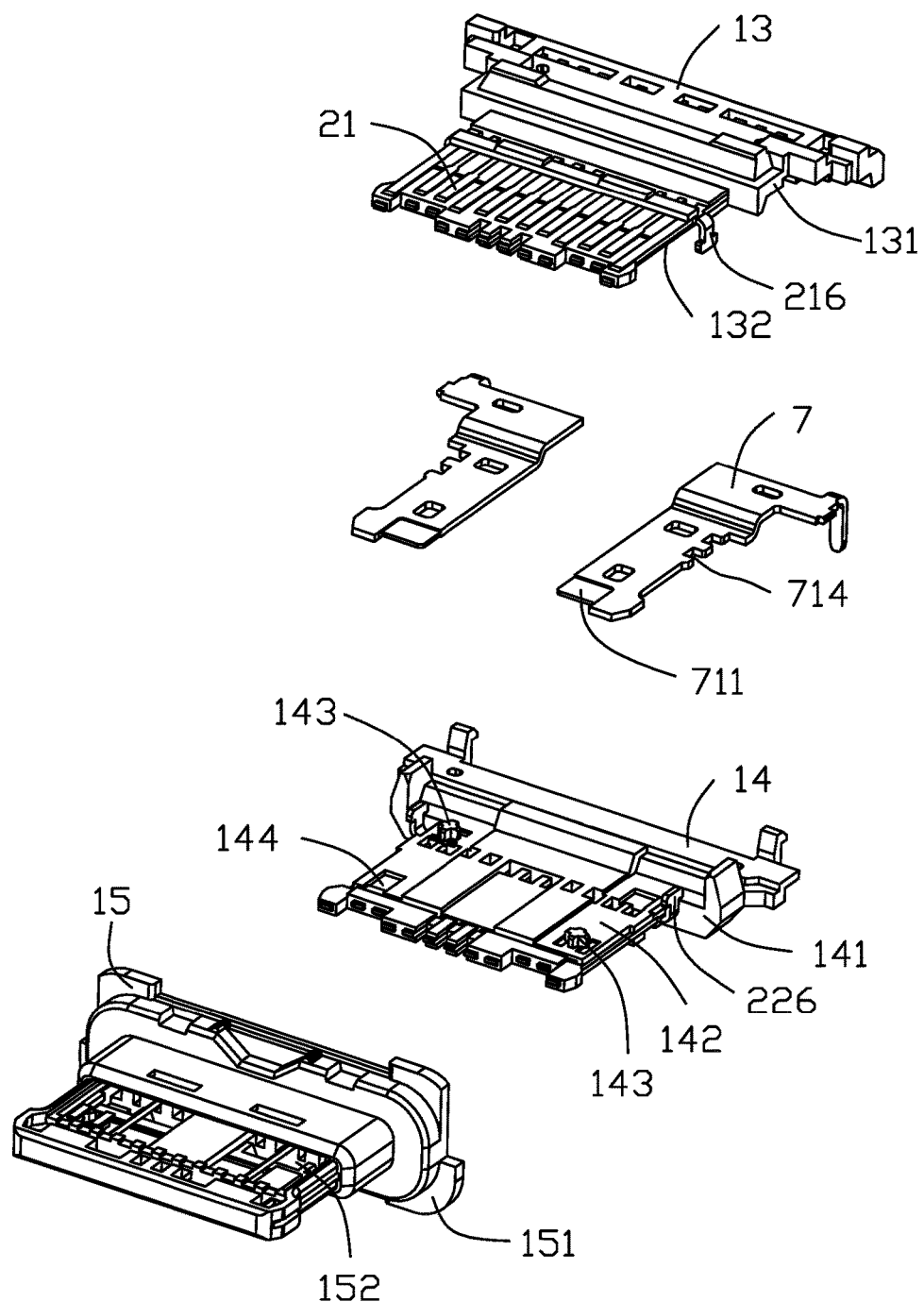
FIG. 3 is an exploded view of a contact module of the electrical connector.
Figure 4:
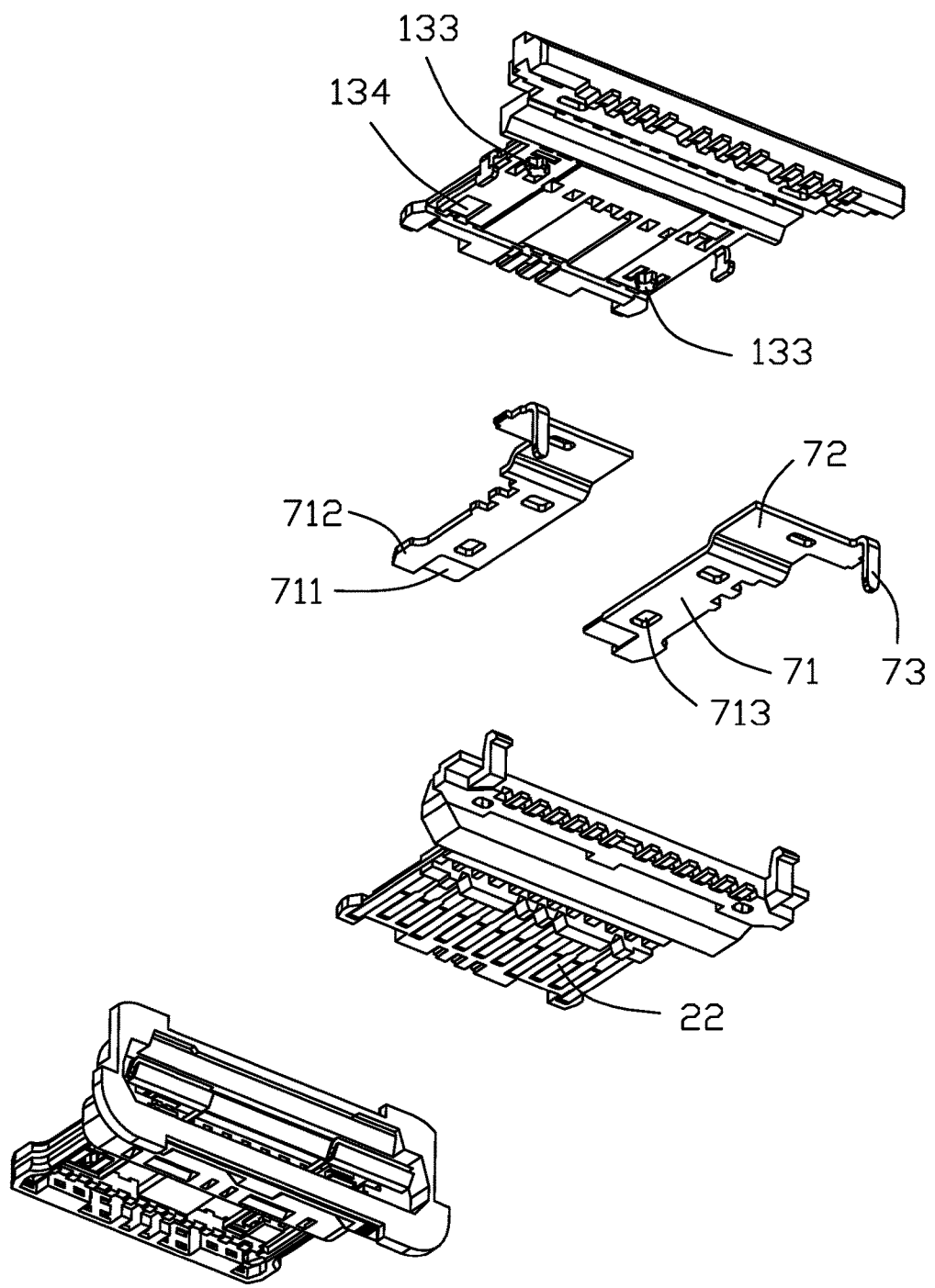
FIG. 4 is a view similar to FIG. 3 but from another perspective.

The insulative housing 1 has a base 11 and a front tongue 12. As shown in FIGS. 3 and 4, the insulative housing 1 is constructed of an upper body 13, a lower body 14, and an over-mold 15. The upper body 13 has a base portion 131 and a tongue portion 132, the lower body 14 has a base portion 141 and a tongue portion 142, and the over-mold 15 has a base portion 151 and a tongue portion 152. The base portions 131, 141, and 151 constitute the base 11; the tongue portions 132, 142, and 152 constitute the tongue 12.

Figure 5:
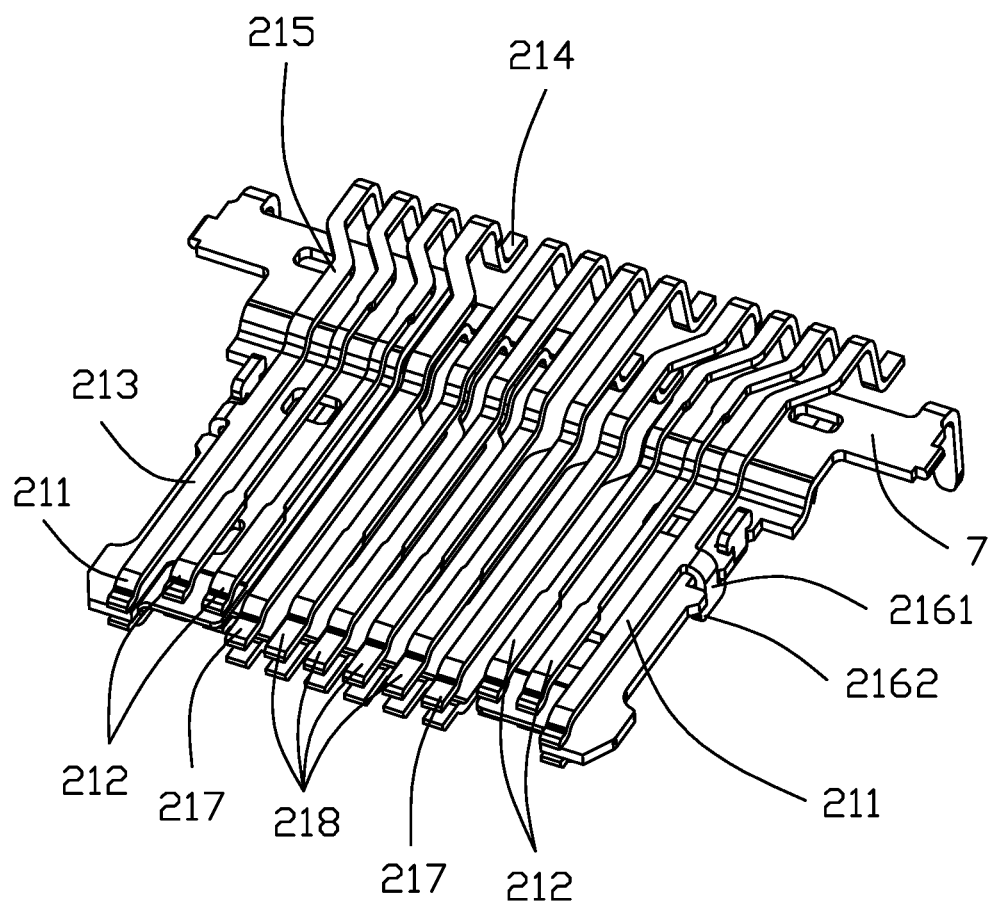
FIG. 5 is a perspective view showing structural relationship between a pair of shielding plates and two rows of contacts of the electrical connector.
Figure 6:
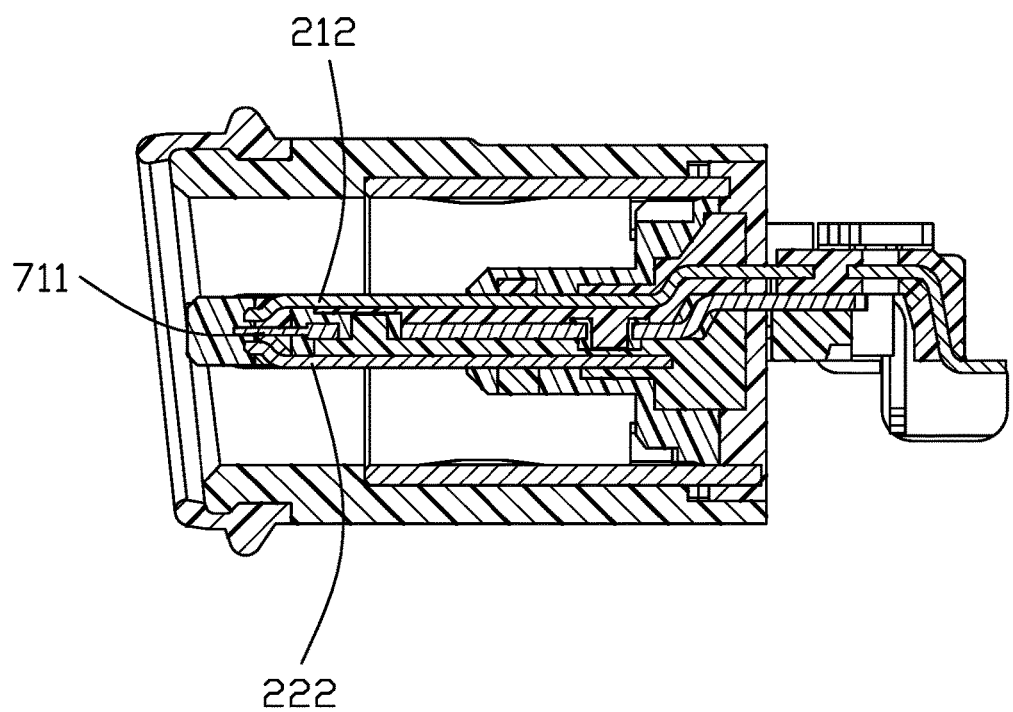
FIG. 6 is a cross-sectional view of the electrical connector taken along line A-A in FIG. 1.

Referring also to FIG. 5, an upper row of contacts 21 are secured to the upper body 13 and a lower row of contacts 22 are secured to the lower body 14. The upper row of contacts 21 and the lower row of contacts 22 are equal in number and aligned one by one in an up-and-down direction. The upper row of contacts 21 include two outermost ground contacts 211, two pairs of high-speed differential signal contacts 212 next to the ground contacts 211, two power contacts 217, and four lower speed signal contacts 218 between the two power contacts. Each contact 21 has a contacting portion 213, a soldering portion 214, and a connecting portion 215. The contacting portion 213 has a front bend. The contacting portion 213 of the ground contact 211 further has a hook 216 at an outer side thereof. The hook 216 has an extending portion 2161 and a hooking portion 2162. The lower row of contacts 22 are arranged and structured in essentially the same way as the upper row of contacts 21, e.g., the contacting portion of the lower ground contact has a hook 226 with an extending portion 2261 and a hooking portion 2262. The hooks 216 and 226 are staggered in a front-and-back direction.

The pair of metallic shielding plates 7 at arranged at two outer sides of the tongue 12 between associated ground contacts 211 and differential signal contacts 212 of the upper and lower rows of contacts 21 and 22, respectively. The shielding plate 7 spans between and forwardly beyond the front contacting portions 213 of the upper pair of differential signal contacts 211 and the front contacting portions 213 of the lower pair of differential signal contacts 211 for effective shielding between the upper pair of differential signal contacts and the lower pair of differential signal contacts. The shielding plate 7 has a first plate portion 71 at the tongue 12, a second plate portion 72 at the base 11, and a soldering leg 73. The first plate portion 71 has a thinned region 711 at a front thereof toward which the front bends of the contacting portion 213 of the differential signal contacts 211 are bent. With the thinned region 711, the contacting portion bends of the differential signal pair will not become too close to the shielding plate, i.e., the shielding plate is distanced from the bends due to the thinned region. The thinned region 711 does not need to span to the outer side of the first plate portion 71 where the ground contacts 211 are situated immediately above or below. The first plate portion 71 has a side latch 712 and two notches 714. The second plate portion 72 may have a feature to contact the shielding shell 3.

Referring to FIGS. 3-6, the tongue portion 132 of the upper body 13 has a pair of positioning posts 133 and the lower body tongue portion 142 has a pair of corresponding holes 144. Similarly, the lower body tongue portion 142 further has posts 143 and the upper body tongue portion 132 has corresponding holes 134. The first plate portion 71 of the shielding plate 7 also has holes 713. In manufacturing, the upper contacts 21 and the upper body 13 are insert molded and the lower contacts 22 and the lower body 14 are insert molded, then the two insert molded subassemblies and the two shielding plates Tare assembled together, and subsequently the over-mold 15 is applied to form a contact module. In the meanwhile, the extending portion 2161 of the upper ground contact 211 passes through one hole 714 of an associated shielding plate 7 and the extending portion 2161 of the lower ground contact 211 passes through the other hole 714 of the associated shielding plate 7, and corresponding hooking portion 2162 engages a distal surface of the shielding plate 7. Therefore, the contact module is firmly constructed and held as a unit. As shown in FIG. 5, the shielding plate 7 does not span under contacts 217 and 218. Also, the thinned region 711 is slightly indented rearwardly.

Provision of the thinned region 711 increases a distance between the shielding plate 7 and the bends of the differential signal pair, thus avoiding risk of contact between the shielding plate and the differential signal contacts.

What is claimed is:

1. An electrical connector comprising:
   an insulative housing having a base and a tongue;
   an upper and lower rows of contacts secured in the insulative housing and exposed to two opposite surfaces of the tongue, respectively, each contact having a front contacting portion;
   a shielding shell enclosing the insulative housing; and
   a shielding plate mounted in the insulative housing; wherein
   each row of contacts include a pair of differential signal contacts, the contacting portion of each of the pair of differential signal contacts having a front bend;
   the shielding plate spans between and forwardly beyond the front contacting portions of the upper pair of differential signal contacts and the front contacting portions of the lower pair of differential signal contacts, the shielding plate having a front thinned region; and
   the front bend is bent toward the front thinned region.

2. The electrical connector as claimed in claim 1, wherein there are a pair of shielding plates separated from each other and two pairs of differential signal contacts in each row of contacts.

3. The electrical connector as claimed in claim 1, wherein the shielding plate is in contact with the shielding shell.

4. The electrical connector as claimed in claim 1, wherein each row of contacts include an outermost ground contact next to the pair of differential signal contacts, the ground contact having at an outer side thereof a hook engaging the shielding plate.

5. The electrical connector as claimed in claim 1, wherein the shielding plate has a side latch exposed to outside.

* * * * *